(12) United States Patent
Chen et al.

(10) Patent No.: US 10,130,001 B2
(45) Date of Patent: Nov. 13, 2018

(54) SLIDE RAIL ASSEMBLY AND BRACKET DEVICE THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 192 days.

(21) Appl. No.: 14/992,028

(22) Filed: Jan. 11, 2016

(65) Prior Publication Data

US 2017/0095078 A1    Apr. 6, 2017

(30) Foreign Application Priority Data

Oct. 6, 2015   (TW) .............................. 104132954 A

(51) Int. Cl.
  *H05K 7/18*   (2006.01)
  *H05K 7/14*   (2006.01)
  *A47B 88/43*  (2017.01)
(52) U.S. Cl.
  CPC ............. *H05K 7/183* (2013.01); *A47B 88/43* (2017.01); *H05K 7/1489* (2013.01)

(58) Field of Classification Search
  CPC ........ H05K 7/1489; H05K 7/18; H05K 7/183; A47B 88/43
  USPC ........... 248/298.1; 211/26; 312/334.4, 334.5, 312/334.7, 223.1
  See application file for complete search history.

(56) References Cited

U.S. PATENT DOCUMENTS

| 7,677,679 | B2 * | 3/2010 | Hsiung | .................. | A47B 88/49 |
| | | | | | 312/333 |
| 7,694,926 | B2 * | 4/2010 | Allen | .................. | A47B 96/068 |
| | | | | | 211/183 |
| 8,028,965 | B2 | 10/2011 | Chen | | |
| 8,721,012 | B2 * | 5/2014 | Chen | ...................... | A47B 88/49 |
| | | | | | 211/26 |
| 9,144,173 | B2 | 9/2015 | Chen | | |

(Continued)

FOREIGN PATENT DOCUMENTS

CN    103892594 A    7/2014
GB    2459982 A      11/2009

(Continued)

*Primary Examiner* — Jonathan Liu
*Assistant Examiner* — Guang H Guan
(74) *Attorney, Agent, or Firm* — Winston Hsu

(57) ABSTRACT

The present invention discloses a bracket device for a rail element, which is configured to be mounted to a rack. The bracket device includes a main supporting element, a first supporting element, a second supporting element and a bracket. The main supporting element is connected to the rail element. The first supporting element is movable relative to the main supporting element. The second supporting element is movable relative to the first supporting element. The bracket is mounted to the second supporting element, and configured to be mounted to the rack.

6 Claims, 6 Drawing Sheets

(56) References Cited

U.S. PATENT DOCUMENTS

| | | | |
|---|---|---|---|
| 9,258,923 B2* | 2/2016 | Chen | H05K 7/1489 |
| 9,313,914 B2* | 4/2016 | Judge | H05K 7/1489 |
| 9,328,769 B1 | 5/2016 | Chen | |
| 9,370,120 B2* | 6/2016 | Chen | A47B 96/025 |
| 9,504,181 B2* | 11/2016 | Chen | H05K 7/1489 |
| 9,560,786 B2* | 1/2017 | Chen | H05K 7/1489 |
| 9,629,460 B1* | 4/2017 | Chen | H05K 7/1489 |
| 9,681,573 B2* | 6/2017 | Chen | H05K 7/1489 |
| 2004/0120106 A1* | 6/2004 | Searby | G06F 1/181 |
| | | | 361/679.58 |
| 2006/0152115 A1 | 7/2006 | Dubon | |
| 2012/0161599 A1 | 6/2012 | Chen | |
| 2012/0170878 A1 | 7/2012 | Yu | |
| 2014/0217049 A1 | 8/2014 | Chen | |
| 2014/0265786 A1 | 9/2014 | Chen | |
| 2014/0339975 A1* | 11/2014 | Fan | A47B 88/04 |
| | | | 312/334.1 |
| 2015/0129526 A1 | 5/2015 | Chen | |
| 2015/0189989 A1 | 7/2015 | Chen | |
| 2016/0278232 A1 | 9/2016 | Chen | |
| 2017/0095078 A1* | 4/2017 | Chen | H05K 7/1489 |

FOREIGN PATENT DOCUMENTS

| | | |
|---|---|---|
| JP | 3197165 U | 4/2015 |
| JP | 3198041 U | 6/2015 |

\* cited by examiner

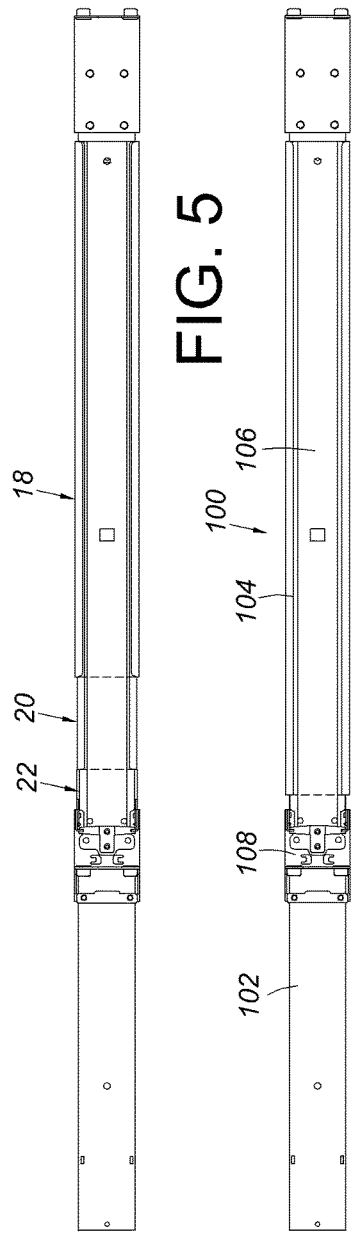
FIG. 5
FIG. 8 Prior Art
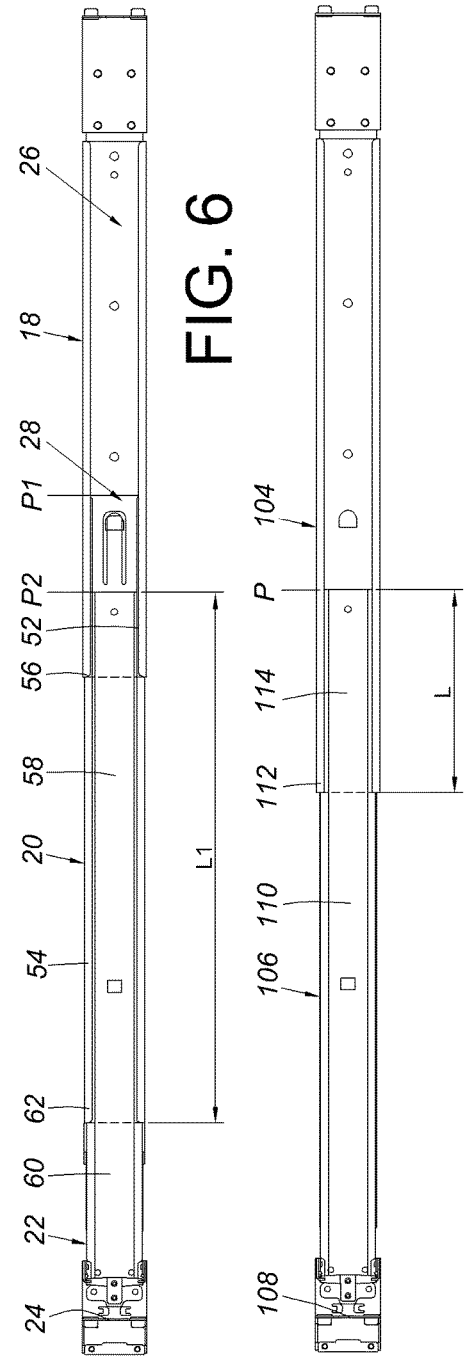
FIG. 6
FIG. 9 Prior Art

SLIDE RAIL ASSEMBLY AND BRACKET DEVICE THEREOF

BACKGROUND OF THE INVENTION

1. Field of the Invention

The present invention relates to a slide rail assembly and a bracket device, and more particularly, to a slide rail assembly comprising an adjustable bracket device.

2. Description of the Prior Art

Generally, a rack-mounted electronic equipment, such as a rack-mounted server, can be mounted to a rack through a pair of slide rail assemblies. Each of the slide rail assemblies can be mounted to two posts of the rack by two brackets. For meeting different market requirements, a product capable of adjusting positions of a bracket is developed. In a related patent, such as U.S. Pat. No. 8,028,965 B2 discloses an adjustable bracket for a slide assembly, which is disposed on a slide assembly (10) through a fixing base (30). A sliding member (50) is movable relative to the fixing base (30) for allowing a fixing member (70), which is connected to the sliding member (50), to adapt to two posts separated by different distances in response to position adjustment of the sliding member (50), so as to fit racks with different depths.

As shown in FIG. 8, a slide rail assembly 100 of the prior art comprises a rail element 102, a base 104, a sliding element 106 and a bracket 108. The base 104 is connected to the rail element 102. The sliding element 106 is connected to the bracket 108. As shown in FIG. 9, the sliding element 106 can be operatively moved to an extension position P relative to the base (104), such that the bracket 108 can be mounted to a post of a rack (not shown) in response to movement of the sliding element 106. Wherein, when the sliding element 106 is located at the extension position P, an extension section 110 of the sliding element 106 is extended beyond an end part 112 of the base, and a supporting section 114 with an overall length L of the sliding element 106 is only supported by the base 104. Therefore, supporting strength of the slide rail assembly is an important topic in related technology.

SUMMARY OF THE INVENTION

The present invention relates to an adjustable bracket device.

According to an embodiment of the present invention, a bracket device for a rail element is configured to be mounted to a rack. The bracket device comprises a main supporting element, a first supporting element, a second supporting element and a bracket. The main supporting element is configured to be connected to the rail element. The first supporting element is connected to the main supporting element and movable relative to the main supporting element. The second supporting element is connected to the first supporting element and movable relative to the first supporting element. The bracket is mounted to the second supporting element, and configured to be mounted to the rack.

According to the above embodiment, the bracket device further comprises a supporting base connected to the first supporting element for moving with the first supporting element to support the rail element.

According to the above embodiment, the first supporting element comprises a first limiting part. The main supporting element comprises a second limiting part. The first limiting part of the first supporting element is configured to abut against the second limiting part of the main supporting element when the first supporting element is moved to a first extension position relative to the main supporting element.

Preferably, the second limiting part of the main supporting element comprises an opening and an abutting wall adjacent to the opening, and the first limiting part of the first supporting element comprises an elastic section and a protrusion section connected to the elastic section. The protrusion section is configured to abut against the abutting wall through the opening.

Preferably, the first supporting element comprises a first blocking part. The second supporting element comprises a second blocking part, and the second blocking part of the second supporting element is configured to abut against the first blocking part of the first supporting element when the second supporting element is moved to a second extension position relative to the first supporting element.

According to the above embodiment, the main supporting element has a pair of supporting walls and a longitudinal wall connected between the pair of supporting walls. A main passage is defined by the pair of supporting walls and the longitudinal wall. At least one portion of the first supporting element is arranged in the main passage. The first supporting element has a pair of first supporting walls and a first longitudinal wall connected between the pair of first supporting walls. A supporting passage is defined by the pair of first supporting walls and the first longitudinal wall. At least one portion of the second supporting element is arranged in the supporting passage.

According to another embodiment of the present invention, a bracket device for a rail element is configured to be mounted to a rack. The bracket device comprises a main supporting element, a first supporting element, a second supporting element and a bracket. The main supporting element is configured to be connected to the rail element. The main supporting element has a main passage. The first supporting element comprises a first supporting section and a first extension section. The first supporting section and the first extension section have a supporting passage. When the first supporting element is moved to a first extension position along the main passage, the first extension section of the first supporting element is extended beyond the main supporting element, and the first supporting section of the first supporting element is supported by the main supporting element. The second supporting element comprises a second supporting section and a second extension section. When the second supporting element is moved to a second extension position along the supporting passage, the second extension section of the second supporting element is extended beyond the first extension section of the first supporting element, and the second supporting section of the second supporting element is supported by the first extension section and the first supporting section of the first supporting element. The bracket is mounted to the second extension section of the second supporting element, and configured to be mounted to the rack.

According to another embodiment of the present invention, a slide rail assembly comprises a rail element, a main supporting element, a first supporting element and a second supporting element. The rail element has a first wall, a second wall and an extension wall connected between the first wall and the second wall. The main supporting element is connected to a backside of the extension wall of the rail element. The main supporting element has a pair of supporting walls and a longitudinal wall connected between the pair of supporting walls. A main passage is defined by the pair of supporting walls and the longitudinal wall. The first supporting element has at least one portion arranged in the main passage of the main supporting element. The first supporting element has a pair of first supporting walls and a first longitudinal wall connected between the pair of first supporting walls. A supporting passage is defined by the pair of first supporting walls and the first longitudinal wall. The second supporting element has at least one portion arranged in the supporting passage of the first supporting element. The second supporting element has a pair of second supporting walls and a second longitudinal wall connected between the pair of second supporting walls.

According to the above embodiment of the slide rail assembly of the present invention, the slide rail assembly further comprises a supporting base connected to the first supporting element. The supporting base comprises at least one supporting feature holding one of the first wall and the second wall of the rail element in order to move with the first supporting element for supporting the rail element.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a diagram showing the bracket of the present invention being adjusted to a same position as a bracket of the prior art in FIG. 8.

FIG. 6 is a diagram showing the bracket of the present invention being adjusted to a same position as the bracket of the prior art in FIG. 9.

FIG. 8 is a diagram showing a bracket of a slide rail assembly of the prior art being adjusted to a position.

FIG. 9 is a diagram showing the bracket of the slide rail assembly of the prior art being adjusted to another position.

DETAILED DESCRIPTION

Figure 1:
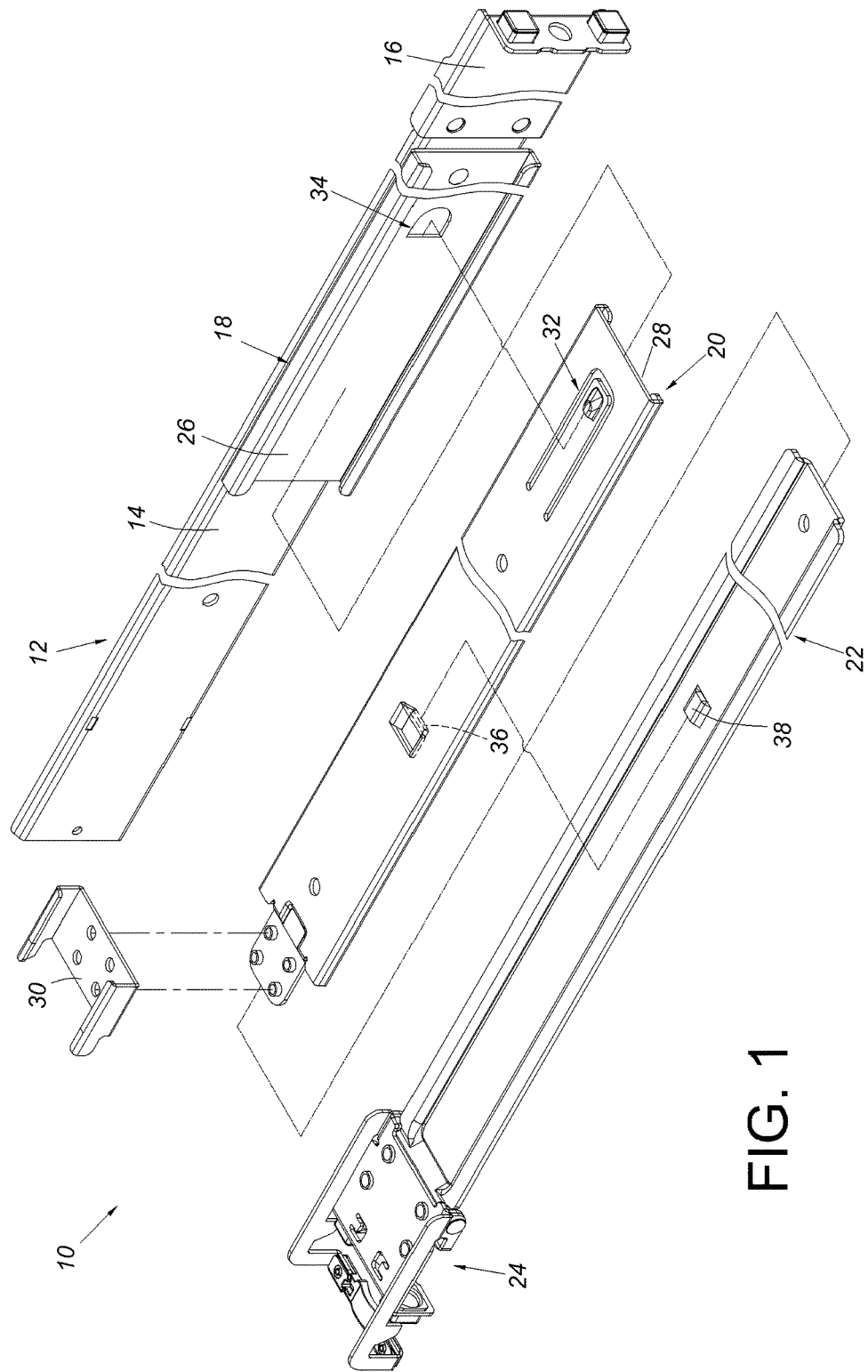
FIG. 1 is an exploded view of a bracket device of a slide rail assembly according to an embodiment of the present invention.

FIG. 1 is a diagram showing a bracket device 10 applicable to a rail element 14 of a slide rail assembly 12 according to an embodiment of the present invention. Preferably, the rail element 14 is connected to a first bracket 16. The bracket device 10 comprises a main supporting element 18, a first supporting element 20, a second supporting element 22 and a second bracket 24. The main supporting element 18 is connected to (such as fixedly connected to) the rail element 14. The main supporting element 18 has a longitudinal main passage 26. At least one portion of the first supporting element 20 is arranged in the main passage 26 of the main supporting element 18. The first supporting element 20 has a longitudinal supporting passage 28. At least one portion of the second supporting element 22 is arranged in the supporting passage 28 of the first supporting element 20. The second bracket 24 is mounted to the second supporting element 22. Preferably, the bracket device 10 further comprises a supporting base 30 connected to (such as fixedly connected to) the first supporting element 20. Wherein, the first supporting element 20 comprises a first limiting part 32, the main supporting element 18 comprises a second limiting part 34, the first supporting element 20 further comprises a first blocking part 36, and the second supporting element 22 comprises a second blocking part 38.

Figure 2:
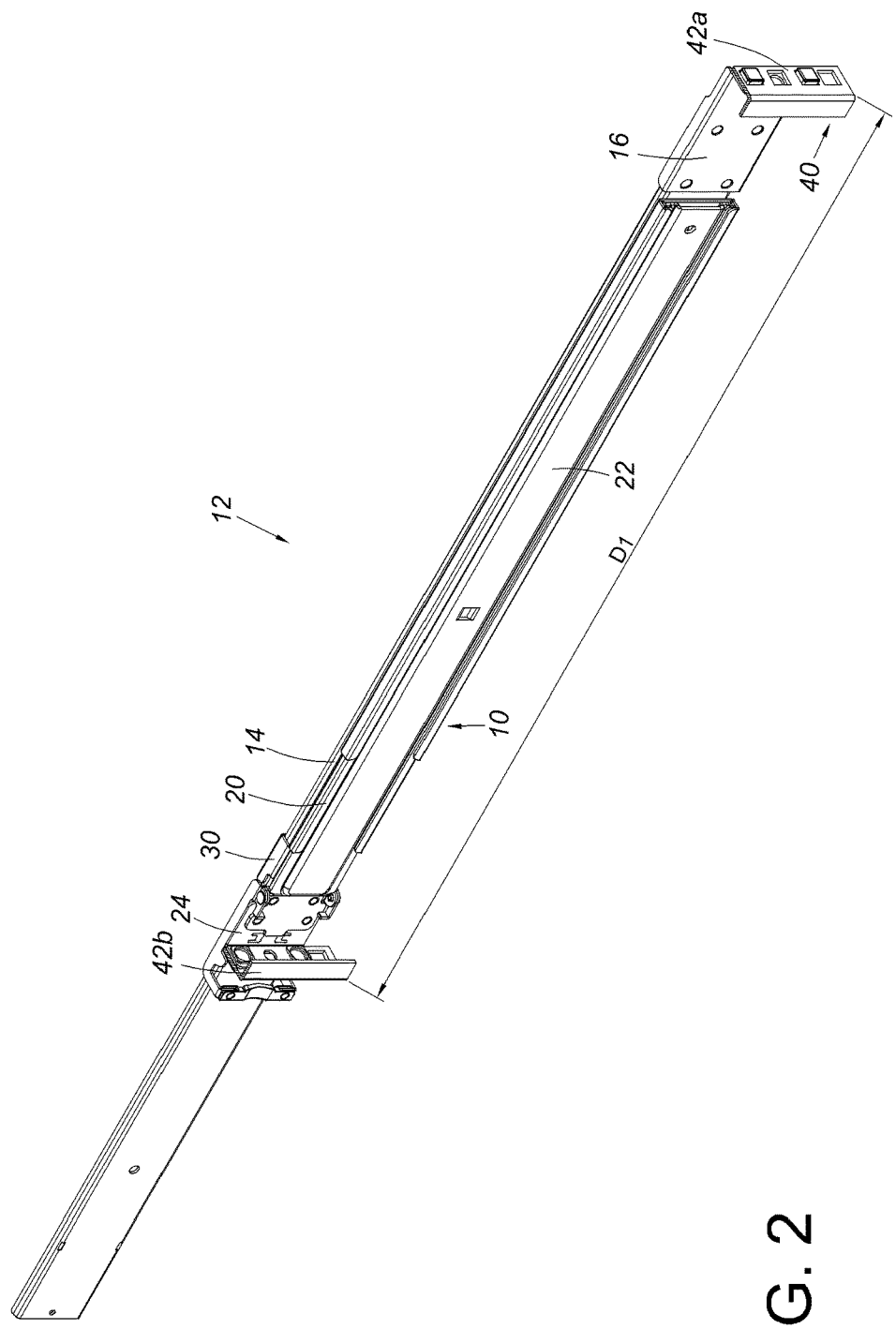
FIG. 2 is a diagram showing the slide rail assembly being mounted to a rack by a first bracket and a second bracket of the bracket device according to an embodiment of the present invention.

As shown in FIG. 2, the slide rail assembly 12 is mounted to a first post 42a and a second post 42b of a rack 40 by the first bracket 16 and the second bracket 24. The supporting base 30 is configured to support the rail element 14. Wherein, the first post 42a and the second post 42b are separated by a first distance D1.

Figure 3:
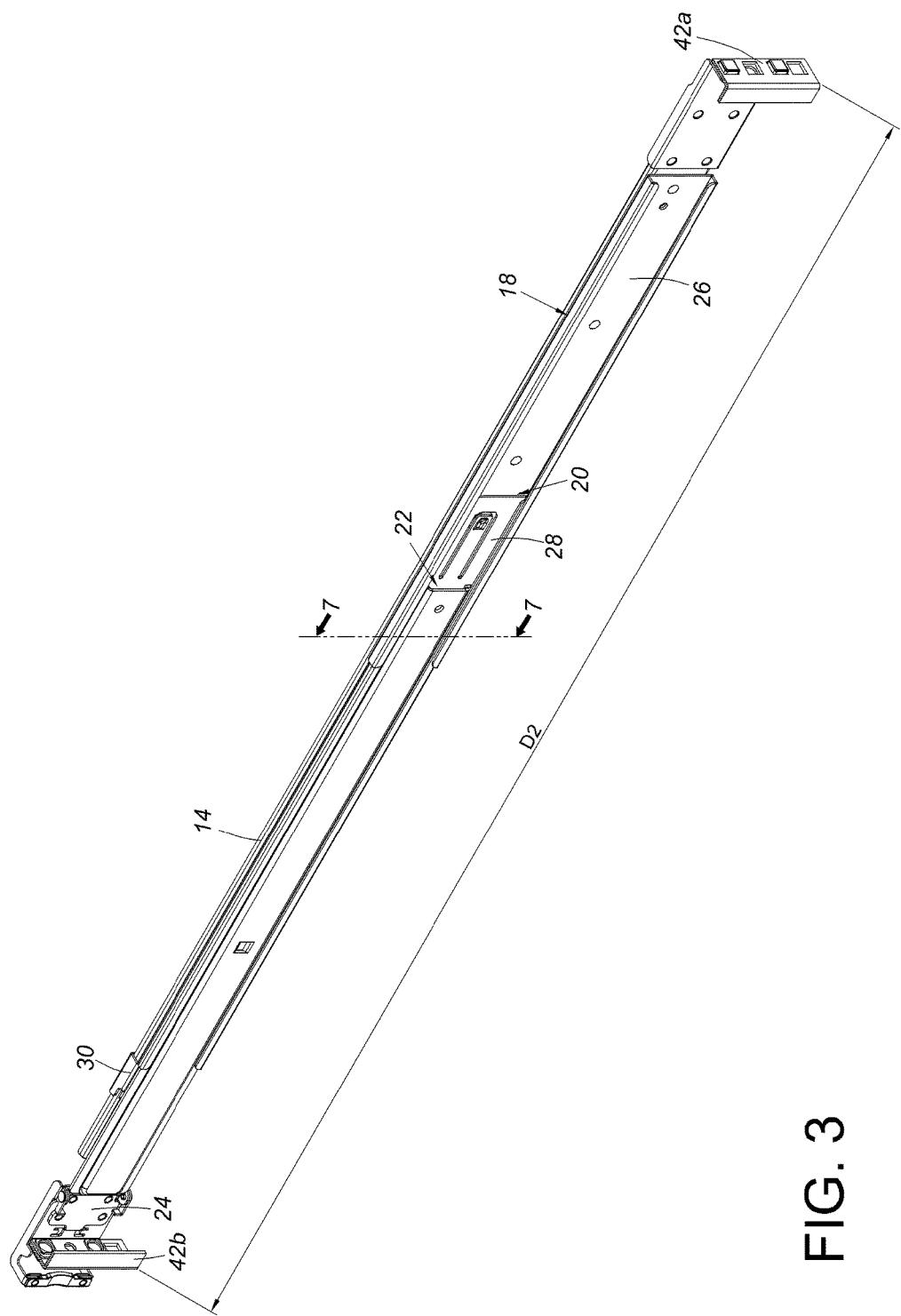
FIG. 3 is a diagram showing the slide rail assembly being mounted to another rack with a deeper depth by the first bracket and the second bracket of the bracket device according to an embodiment of the present invention.

As shown in FIG. 3, when the first post 42a and the second post 42b are separated by a second distance D2 longer than the first distance D1, the first supporting element 20 can be operatively moved relative to the main supporting element 18 longitudinally along the main passage 26, such that the supporting base 30 can be moved relative to the rail element 14 along with the first supporting element 20, in order to support the rail element 14. Moreover, the second supporting element 22 can be operatively moved relative to the first supporting element 20 longitudinally along the supporting passage 28, such that the second bracket 24 can be mounted to the second post 42b.

Figure 4:
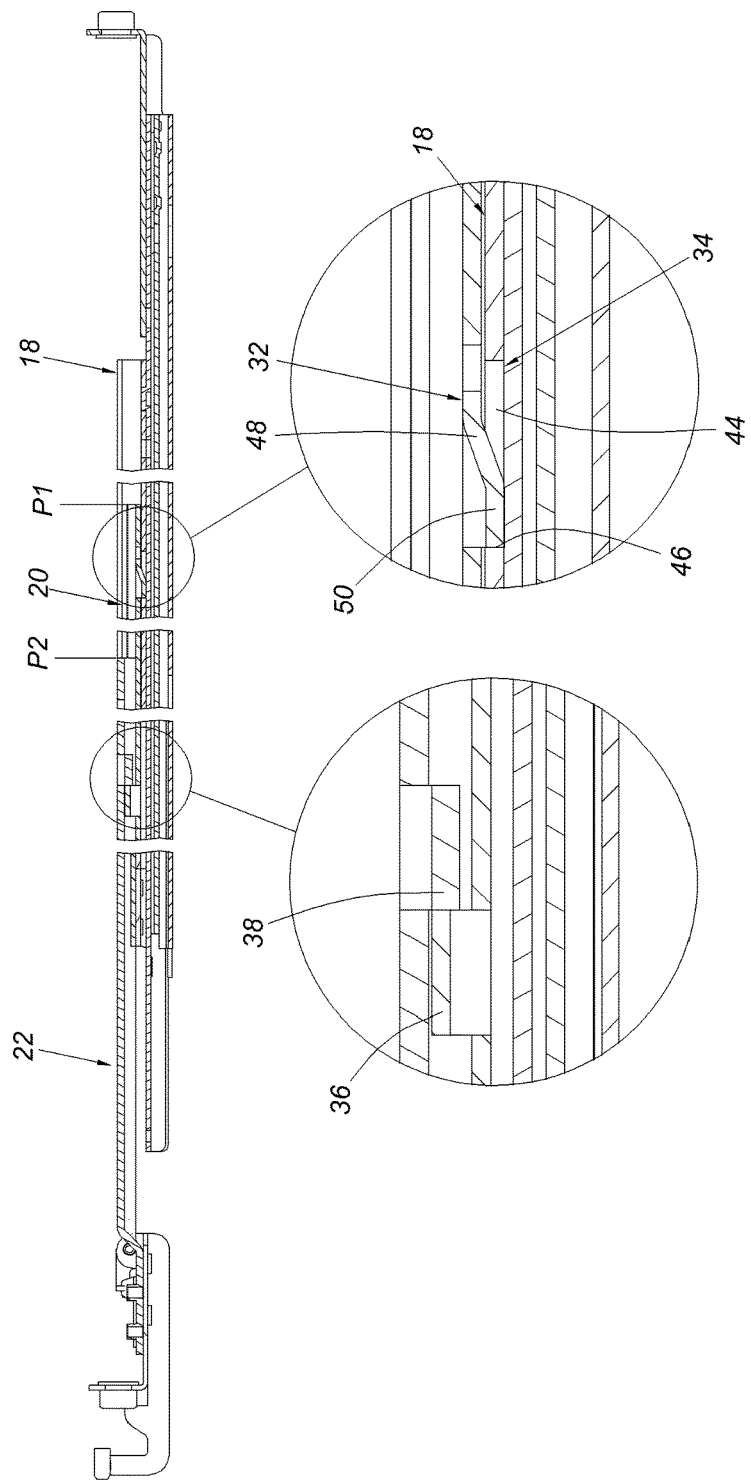
FIG. 4 is a diagram showing a main supporting element and a first supporting element of the bracket device having limiting parts configured to abut against each other, and the first supporting element and a second supporting element of the bracket device having blocking parts configured to abut against each other according to an embodiment of the present invention.

As shown in FIG. 4, the second limiting part 34 of the main supporting element 18 comprises an opening 44 and an abutting wall 46 adjacent to the opening 44. The first limiting part 32 of the first supporting element 20 comprises an elastic section 48 and a protrusion section 50 connected to the elastic section 48. When the first supporting element 20 is moved to a first extension position P1 relative to the main supporting element 18, the first limiting part 32 of the first supporting element 20 abuts against the second limiting part 34 of the main supporting element 18. Preferably, the protrusion section 50 of the first limiting part 32 of the first supporting element 20 is configured to abut against the abutting wall 46 through the opening 44 of the second limiting part 34. On the other hand, when the second supporting element 22 is moved to a second extension position P2 relative to the first supporting element 20, the second blocking part 38 of the second supporting element 22 abuts against the first blocking part 36 of the first supporting element 20. In the present embodiment, the first blocking part 36 and the second blocking part 38 are bumps for example.

As shown in FIG. 5, the first supporting element 20 and the second supporting element 22 are adjusted relative to the main supporting element 18, such that the slide rail assembly of the present invention is in a status having a length equivalent to a length of the slide rail assembly of the prior art shown in FIG. 8. Through support of the second supporting element 22, supporting strength of the slide rail assembly of the present invention is greater than supporting strength of the slide rail assembly of the prior art shown in FIG. 8.

As shown in FIG. 6, the first supporting element 20 comprises a first supporting section 52 and a first extension section 54 connected to the first supporting section 52. When the first supporting element 20 is moved to the first extension position P1 along the main passage 26 of the main supporting element 18, the first extension section 54 of the first supporting element 20 is extended beyond an end part 56 of the main supporting element 18, and the first supporting section 52 of the first supporting element 20 is supported by the main supporting element 18. On the other hand, the second supporting element 22 comprises a second supporting section 58 and a second extension section 60 connected to the second supporting section 58. When the second supporting element 22 is moved to the second extension position P2 along the supporting passage 28 of the first supporting element 20, the second extension section 60 of the second supporting element 22 is extended beyond an end part 62 of the first extension section 54 of the first supporting element 20, and the second supporting section 58 of the second supporting element 22 is supported by the first extension section 54 and the first supporting section 52 of the first supporting element 20. That is to say, when the second supporting element 22 is located at the second extension position P2, the second supporting section 58 with an overall length L1 of the second supporting element 22 is not only supported by the main supporting element 18 through the first supporting section 52 of the first supporting element 20, but also supported by the first extension section 54 of the first supporting element 20 at a same time. Wherein, the second bracket 24 is mounted to the second extension section 60 of the second supporting element 22. In comparison between the slide rail assembly of the present invention shown in FIG. 6 and the slide rail assembly of the prior art shown in FIG. 9, when the slide rail assemblies are expanded to a same length, the present invention has a supporting distance L1 longer than a supporting distance L of the prior art, in order to provide more stable support. In addition, in contrast to the bracket of the prior art shown in FIG. 9, the bracket device 10 of the present invention can be further expanded, in order to allow the slide rail assembly of the present invention to be mounted between two posts of a rack with a deeper depth (not shown in the figures). That is to say, the present invention can be applied to a wider range than the prior art.

Figure 7:
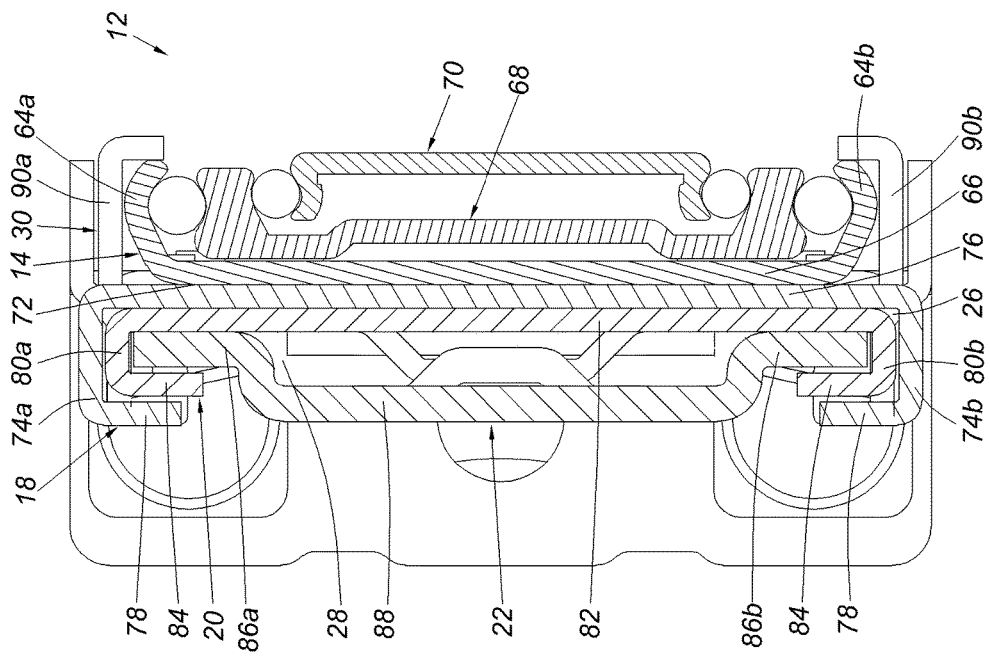
FIG. 7 is a cross-sectional view along line 7-7 in FIG. 3.

FIG. 7 is a diagram showing the rail element 14 of the slide rail assembly 12 according to an embodiment of the present invention. The rail element 14 comprises a first wall 64a, a second wall 64b and an extension wall 66 connected between the first wall 64a and the second wall 64b. The slide rail assembly 12 further comprises a first rail 68 and a second rail 70, and the first rail 68 and the second rail 70 are movable relative to the rail element 14. The first rail 68 is mounted on a side of the extension wall 66. The second rail 70 is mounted with the first rail 68. The main supporting element 18 is connected to a backside 72 (different from the side where the first rail 68 and the second rail 70 are arranged) of the extension wall 66 of the rail element 14.

The main supporting element 18 has a pair of supporting walls 74a, 74b and a longitudinal wall 76 connected between the pair of supporting walls 74a, 74b. The main passage 26 is defined by the pair of supporting walls 74a, 74b and the longitudinal wall 76. Each of the supporting walls 74a, 74b has a first bending part 78.

At least one portion of the first supporting element 20 is arranged in the main passage 26. The first supporting element 20 has a pair of first supporting walls 80a, 80b and a first longitudinal wall 82 connected between the pair of first supporting walls 80a, 80b. Wherein, the pair of first supporting walls 80a, 80b correspond to the pair of supporting walls 74a, 74b, and the first longitudinal wall 82 corresponds to the longitudinal wall 76. The supporting passage 28 is defined by the pair of first supporting walls 80a, 80b and the first longitudinal wall 82. Each of the first supporting walls 80a, 80b has a second bending part 84. The second bending part 84 corresponds to the first bending part 78.

At least one portion of the second supporting element 22 is arranged in the supporting passage 28. The second supporting element 22 has a pair of second supporting walls 86a, 86b and a second longitudinal wall 88 connected between the pair of second supporting walls 86a, 86b. The pair of second supporting walls 86a, 86b correspond to the pair of first supporting walls 80a, 80b.

The supporting base 30 is connected to the first supporting element 20 for moving with the first supporting element 20 in order to support the rail element 14. The supporting base 30 comprises at least one supporting feature, such as a pair of supporting features 90a, 90b configured to hold the first wall 64a and the second wall 64b of the rail element 14.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A slide rail assembly, comprising:
 a rail element having a first wall, a second wall and an extension wall connected between the first wall and the second wall;
 a main supporting element connected to a backside of the extension wall of the rail element, the main supporting element having a pair of supporting walls and a longitudinal wall connected between the pair of supporting walls, a main passage being defined by the pair of supporting walls and the longitudinal wall;
 a first supporting element having at least one portion arranged in the main passage of the main supporting element, the first supporting element having a pair of first supporting walls and a first longitudinal wall connected between the pair of first supporting walls, a supporting passage being defined by the pair of first supporting walls and the first longitudinal wall, the longitudinal wall of the main supporting element being arranged between the rail element and the first supporting element;
 a second supporting element having at least one portion arranged in the supporting passage of the first supporting element, the second supporting element having a pair of second supporting walls and a second longitudinal wall connected between the pair of second supporting walls; and
 a supporting base fixedly connected to the first supporting element, the supporting base comprising at least one supporting feature directly holding one of the first wall and the second wall of the rail element, the supporting base being movable with the first supporting element to support the rail element;
 wherein the first supporting element comprises a first limiting part, the main supporting element comprises a second limiting part, the first limiting part of the first supporting element abuts against the second limiting part of the main supporting element when the first supporting element is moved to a first extension position relative to the main supporting element;
 wherein the first supporting element comprises a first blocking part, the second supporting element comprises a second blocking part, the second blocking part of the second supporting element abuts against the first blocking part of the first supporting element when the second supporting element is moved to a second extension position relative to the first supporting element.

2. The slide rail assembly of claim 1, further comprising a bracket mounted to the second supporting element, and the bracket being configured to be mounted to a rack.

3. The slide rail assembly of claim 1, further comprising:
a first rail mounted on a side of the extension wall of the rail element; and
a second rail mounted with the first rail;
wherein the backside of the extension wall of the rail element is opposite to the side, on which the first rail is mounted, of the extension wall of the rail element.

4. A slide rail assembly, comprising:
a rail element having a first wall, a second wall and an extension wall connected between the first wall and the second wall;
a main supporting element connected to a backside of the extension wall of the rail element, the main supporting element having a pair of supporting walls and a longitudinal wall connected between the pair of supporting walls, a main passage being defined by the pair of supporting walls and the longitudinal wall;
a first supporting element having at least one portion arranged in the main passage of the main supporting element, the first supporting element having a pair of first supporting walls and a first longitudinal wall connected between the pair of first supporting walls, a supporting passage being defined by the pair of first supporting walls and the first longitudinal wall;
a second supporting element having at least one portion arranged in the supporting passage of the first supporting element, the second supporting element having a pair of second supporting walls and a second longitudinal wall connected between the pair of second supporting walls;
a bracket mounted to the second supporting element, and the bracket is configured to be mounted to a rack; and
a supporting base fixedly connected to the first supporting element the supporting base comprising at least one supporting feature directly holding one of the first wall and the second wall of the rail element, the supporting base being movable with the first supporting element to support the rail element;
wherein the first supporting element comprises a first limiting part, the main supporting element comprises a second limiting part, the first limiting part of the first supporting element abuts against the second limiting part of the main supporting element when the first supporting element is moved to a first extension position relative to the main supporting element;
wherein the first supporting element comprises a first blocking part, the second supporting element comprises a second blocking part, the second blocking part of the second supporting element abuts against the first blocking part of the first supporting element when the second supporting element is moved to a second extension position relative to the first supporting element.

5. The slide rail assembly of claim 4, further comprising:
a first rail mounted on a side of the extension wall of the rail element; and
a second rail mounted with the first rail;
wherein the backside of the extension wall of the rail element is opposite to the side, on which the first rail is mounted, of the extension wall of the rail element.

6. A slide rail assembly, comprising:
a rail element comprising a first wall, a second wall and an extension wall connected between the first wall and the second wall;
a first rail mounted on a side of the extension wall of the rail element;
a second rail mounted with the first rail;
a main supporting element connected to a backside of the extension wall of the rail element, the backside being opposite to the side, on which the first rail is mounted, of the extension wall of the rail element, the main supporting element having a pair of supporting walls and a longitudinal wall connected between the pair of supporting walls, a main passage being defined by the pair of supporting walls and the longitudinal wall;
a first supporting element having at least one portion arranged in the main passage of the main supporting element, the first supporting element having a pair of first supporting walls and a first longitudinal wall connected between the pair of first supporting walls, a supporting passage being defined by the pair of first supporting walls and the first longitudinal wall;
a second supporting element having at least one portion arranged in the supporting passage of the first supporting element, the second supporting element having a pair of second supporting walls and a second longitudinal wall connected between the pair of second supporting walls; and
a supporting base fixedly connected to the first supporting element, the supporting base comprising at least one supporting feature directly holding one of the first wall and the second wall of the rail element, the supporting base being movable with the first supporting element to support the rail element;
wherein the first supporting element comprises a first limiting part, the main supporting element comprises a second limiting part, the first limiting part of the first supporting element abuts against the second limiting part of the main supporting element when the first supporting element is moved to a first extension position relative to the main supporting element;
wherein the first supporting element comprises a first blocking part, the second supporting element comprises a second blocking part, the second blocking part of the second supporting element abuts against the first blocking part of the first supporting element when the second supporting element is moved to a second extension position relative to the first supporting element.

\* \* \* \* \*